United States Patent
Boyd et al.

(10) Patent No.: US 9,148,481 B1
(45) Date of Patent: Sep. 29, 2015

(54) EMBEDDED INSTRUMENTATION ARCHITECTURE

(71) Applicant: Sandia Corporation, Albuquerque, NM (US)

(72) Inventors: Gerald M. Boyd, Albuquerque, NM (US); Jeffrey Farrow, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/477,446

(22) Filed: Sep. 4, 2014

(51) Int. Cl.
- *H04B 3/00* (2006.01)
- *H04L 29/08* (2006.01)
- *H04L 12/40* (2006.01)
- *H03M 1/12* (2006.01)

(52) U.S. Cl.
CPC .............. *H04L 67/12* (2013.01); *H03M 1/1205* (2013.01); *H04L 12/40* (2013.01)

(58) Field of Classification Search
CPC ............ H04L 25/0272; H04L 25/0292; H04L 25/028; H04L 25/08; H04L 7/0008
USPC .................................. 375/257, 316, 219, 295
See application file for complete search history.

(56) References Cited

U.S. PATENT DOCUMENTS

| | | | |
|---|---|---|---|
| 6,169,505 B1 * | 1/2001 | Nishimura et al. | 341/141 |
| 6,573,762 B1 | 6/2003 | Wessendorf et al. | |
| 6,850,176 B2 | 2/2005 | Laflaquiere et al. | |
| 7,253,387 B2 | 8/2007 | Archer et al. | |
| 8,462,248 B2 | 6/2013 | Berezin | |
| 8,547,461 B2 | 10/2013 | Jung et al. | |
| 2003/0058345 A1 | 3/2003 | Morris et al. | |
| 2010/0039306 A1 * | 2/2010 | Simony et al. | 341/156 |
| 2011/0285884 A1 | 11/2011 | Bellingrath et al. | |
| 2014/0014821 A1 | 1/2014 | Kawahito | |

* cited by examiner

*Primary Examiner* — Zewdu Kassa
(74) *Attorney, Agent, or Firm* — Medley, Behrens & Lewis, LLC

(57) ABSTRACT

The various technologies presented herein relate to generating copies of an incoming signal, wherein each copy of the signal can undergo different processing to facilitate control of bandwidth demands during communication of one or more signals relating to the incoming signal. A signal sharing component can be utilized to share copies of the incoming signal between a plurality of circuits/components which can include a first A/D converter, a second A/D converter, and a comparator component. The first A/D converter can operate at a low sampling rate and accordingly generates, and continuously transmits, a signal having a low bandwidth requirement. The second A/D converter can operate at a high sampling rate and hence generates a signal having a high bandwidth requirement. Transmission of a signal from the second A/D converter can be controlled by a signaling event (e.g., a signal pulse) being determined to have occurred by the comparator component.

17 Claims, 5 Drawing Sheets

EMBEDDED INSTRUMENTATION ARCHITECTURE

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

In a conventional instrumentation system, device wiring can cause sampling of a channel to be conducted in a particular manner. For example, a single channel (e.g., a first pin of an integrated circuit (IC)) is typically connected to a first sensor that generates data that is indicative of an operational condition of a process. During operation of the process, the data generated by the first sensor can undergo a slow transition between states (e.g., a change in voltage as a function of temperature), and/or the information provided by the sensor (e.g., temperature, pressure, velocity, etc.) is of minor importance with regard to operation of the process. Accordingly, the first sensor may be connected, via the single channel, to a first analog to digital (A/D) converter which is incorporated into the IC and is configured to sample the data generated by the first sensor at a relatively low rate. For example, sampling of data output by the first sensor can be performed at every 2 milliseconds (ms).

In another example, a second pin of the IC may be connected to a second sensor whose readings provide critical information about the monitored process, and accordingly, a higher sampling rate is desired. The second sensor may be connected, via the second input pin, to a second A/D converter that is incorporated into the IC and is configured to operate at a higher sampling rate when compared to the sampling rate of the first A/D converter. Hence, the data from the second A/D converter requires greater communication bandwidth than the data generated by the first A/D converter.

Accordingly, during design of the instrumentation system, a decision has to be made as to the importance of a sensor and the data generated by the sensor in relation to the process being monitored, e.g., decide whether the sensor data is of low or high importance.

Further, by uniquely associating a sensor with a particular A/D converter, while in a first operational state of the monitored system, data generated by the sensor may be of low importance and a low sampling rate is acceptable. However, the system may transition to another operating state, whereby the data generated by the sensor may be critical in determining the operational state (e.g., during forensic analysis, real-time operation, etc.) of the system and a high sampling rate is now required. The unique association of a first sensor with a low sample rate A/D circuit, and a unique association of a second sensor with a high sample rate A/D circuit renders the designed system to operate in an fixed manner, the deficiencies of which may require a system designer to always attach sensors to a high sampling rate A/D converter to ensure that an acceptable sampling rate is available for every possible operating condition of a process, and accordingly any sensor data associated therewith.

SUMMARY

The following is a brief summary of subject matter that is described in greater detail herein. This summary is not intended to be limiting as to the scope of the claims.

The various technologies presented herein relate to construction and operation of an instrumentation system that can simultaneously review an analog signal in at least two different ways, and accordingly, facilitate control of one or more bandwidth requirements for transmitting one or more copies (or replications) of a signal over a communication network. A signal can be received at a signal sharing component, whereby the signal can be received from a sensor or other signal generating device. In an embodiment, the sensor can be monitoring one or more operating conditions pertaining to a process and/or system.

The signal sharing component can generate one or more copies or replications of the incoming signal and forward the various copies to one or more components connected to the signal sharing component. In an embodiment, the signal sharing component can be a demultiplexor or similar component configured to generate a plurality of replications of a received signal. In an embodiment, the incoming signal and the one or more replications can be an analog signal.

A first copy of the incoming signal can be forwarded to a first A/D converter. During conversion of the incoming analog signal to a digital signal, the first A/D converter can operate at a low sampling rate. In an embodiment, owing to the low bandwidth requirement on a subsequent circuit (e.g., a communication bus), the output signal can be continuously transmitted by the first A/D converter. In a further embodiment, the digital signal can be subjected to processing on a chip that includes the A/D converter, or can be transmitted from the chip to another processing device via a communication bus.

A second copy of the incoming signal can also be provided to a second A/D converter. Further, a third copy of the incoming signal can be forwarded to a comparator. In an embodiment, the first copy, second copy and third copy can be synchronous in terms of timing to facilitate correlating an event detected by the comparator based on the third copy of the incoming signal with a correlating event detected based on the first copy and/or the second copy. For example, a pulse event occurring on the third copy is synchronous with the pulse also present on the first copy and the second copy.

The second A/D converter can operate with a high sampling rate. To minimize the bandwidth demands placed on the communication bus, transmission of a digitized signal formed from the second copy of the incoming signal can be controlled based on an importance of the digitized signal. For example, during a pulse event occurring on the incoming signal, to facilitate analysis and/or understanding of the pulse event it may be desired that the digital signal generated by the second A/D converter is transmitted over the communication bus. However, when the incoming signal is in a low state (e.g., no pulse event is occurring) the high sample rate signal can be discarded by, and/or stored in a buffer by, the second A/D converter.

Initiating and curtailing transmission of the high sample rate signal from the second A/D converter to the communication bus can be controlled in conjunction with signal thresholding determination being performed by the comparator component. In an embodiment, the comparator can compare a magnitude of the third copy of the incoming signal with a threshold value. In an embodiment, while the third copy of the incoming signal is determined by the comparator to be in a low level and/or normal state, (e.g., an unexcited, no signal transition state), the comparator can generate a 'no event' signal. In an embodiment, the 'no event' signal can be forwarded to the second A/D converter, and in response to receiving the 'no event' signal the second A/D converter can discard the high sample rate signal.

In another embodiment, if a signaling event (e.g., a pulse leading edge, a pulse trailing edge, etc.) is determined to exist by the comparator component, an 'event' notification can be generated by the comparator and transmitted to the second A/D converter. In response to receiving the 'event' notification, the second A/D converter can initiate transmission of the high sample rate signal over the communication bus, to facilitate analysis of the high rate signal by an analysis component connected to the communication bus.

In an embodiment, the comparator can further detect the process from which the original signal is being derived returning to its low level state, for example, the signal magnitude returns to a value below the threshold value. Based thereon, the comparator can generate and transmit a 'no event' notification. In response to receiving the 'no event' notification, the second A/D converter can stop transmission of the high sample rate signal over the communication bus, with an according reduction in the bandwidth demand being placed upon the communication bus.

By only transmitting the high sample rate signal during a period at which an 'event' is deemed to be occurring, when 'no event' is occurring the bandwidth requirements can be reduced.

In another embodiment, the threshold value utilized by the comparator can be remotely configured, e.g., via a user interface. Accordingly, as a process transitions through a plurality of states, the threshold value can be reconfigured to facilitate wanted (and to alternatively prevent unwanted) event detection regardless of a state of the process.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
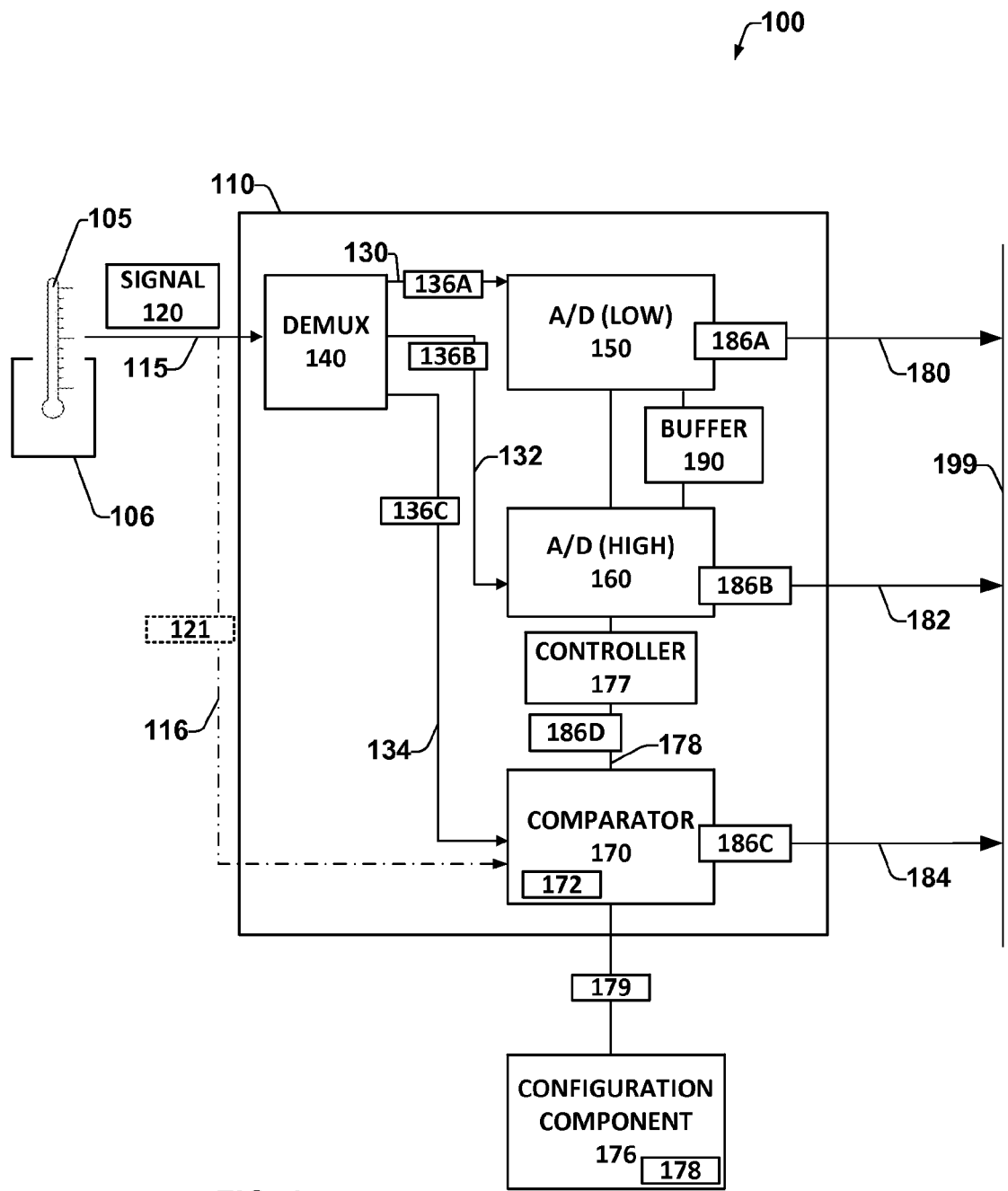
FIG. 1 illustrates a system for concurrently transmitting a signal to a plurality of devices to facilitate control of communication bandwidth, according to an embodiment.

Various technologies pertaining to a multiple channel acquisition system that facilitates simultaneous monitoring in accordance with a plurality of operational criteria are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

It is to be understood that a circuit, component or system may be localized on a single device or distributed across several devices. Additionally, as used herein, the term "exemplary" is intended to mean serving as an illustration or example of something, and is not intended to indicate a preference.

FIG. 1 illustrates a process monitoring configuration 100, according to an embodiment. A process 106 (or system) can be monitored by one or more sensors 105, whereby a sensor 105 can be connected to an instrumentation system 110 via an input channel 115. Sensor 105 can be monitoring any required parameter or physical quantity pertaining to process 106, such as temperature, pressure, velocity, acceleration, deceleration, voltage, current, motion, light, gravity, magnetism, humidity, moisture, sound, composition, chemical composition, and the like as is known to a person skilled in the art.

A signal can be generated by the sensor 105, with the signal acting as an input signal 120 which is input into a signal sharing component (e.g., DEMUX 140, as described further below). In an embodiment, the input signal 120 can be a voltage generated by the sensor 105. Furthermore, in an embodiment, input signal 120 can be an analog signal being continuously generated by sensor 105 during operation of process 106.

In the embodiment presented in FIG. 1, the instrumentation system 110 can act as an intermediary system for monitoring, processing and/or transmission of the incoming signal 120. The instrumentation system 110 can be an application-specific integrated circuit (ASIC) component which can be utilized for embedded instrumentation and data capture for one or more operational conditions of process 106. Instrumentation system 110 can be configured to receive one input signal 120, or a plurality of input signals 120, with data capture operating in accordance with several different regimes, where such regimes can include continuous data capture, continuous data streaming, event capture, event streaming, threshold capture, threshold streaming, any combination of the previously mentioned regimes, and the like.

As shown in FIG. 1, an input signal 120 can be received on the input channel 115 of a signal sharing component which can direct the input signal 120 to a plurality of output channels 130, 132, or 134 of the signal sharing component. In an embodiment, the signal sharing component can be a demultiplexor (DEMUX) component 140. However, it is to be appreciated that any suitable signal splitting and/or signal spreading component can be utilized for the signal sharing component, and the various embodiments presented herein are not limited to a DEMUX-type component. For example, the signal sharing component can be configured to generate copies or replications of the input signal 120, whereby the copies and/or replications can be forwarded to one or more components located on output channels 130, 132, or 134.

For the sake of readability the terms 'channel' and 'pin' can be used interchangeably herein, whereby the reception and/or transmission of a signal via a pin of an IC, or a sub-component thereof, is included in the term 'channel' as well as a signal being transmitted over a conductive track, wire or trace.

On a first output channel 130 of DEMUX 140, a first sample 136A of the input signal 120 is transmitted by the DEMUX 140. On a second output channel 132 of DEMUX 140, a second sample 136B of the input signal 120 is transmitted by the DEMUX 140. On a third output channel 134, a third sample 136C of the input signal 120 is transmitted by the DEMUX 140. It is to be appreciated that while the terms 'first sample 136A', 'second sample 136B', and 'third sample 136C' are used, each of the signals 136A, 136B and 136C are concurrently generated (e.g., shared, copied, replicated) by the DEMUX 140 and thus, in an embodiment any signal content of the first sample 136A is the same as a signal content of the second sample 136B, and further either of the signal content of the first sample 136A and/or the signal content of the second sample 136B is the same as a signal content of the third sample 136C, and furthermore, the signal content of the signal 120 equals the signal content of the first sample 136A which equals the signal content of the second sample 136B which further equals the signal content of the third sample 136C. It is to be appreciated that the content of first sample 136A, the content of second sample 136B, and third sample 136C do not have to be exactly equivalent. For example, any of the signal samples 136A, 136B, or 136C can undergo signal processing. For example, the signal comprising sample 136C can undergo a degree of amplification to facilitate improving the likelihood of a comparator 170 (as further described below) detecting an event (e.g., a pulse) in a signal, while the signaling levels of signals 136A and 136B can remain at the same level as the content of signal 120. In an embodiment, signal samples 136A, 136B, and 136C can undergo any signal processing to facilitate operation of the system 110, such as controlling bandwidth demand (e.g., on bus 199, as described further herein).

In an embodiment, the first output channel 130 can be connected to a first analog-to-digital (A/D) converter 150, whereby A/D converter 150 can be configured to convert signal 136A having an analog format to a signal 186A (e.g., a first converted signal) having a digital format. For example, signal 136A has an analog format comprising a continuous analog signal, while signal 186A has a digital format comprising one or more instances of digital data. Further, the output channel 132 can be connected to a second A/D converter 160 to facilitate conversion of the signal 136B from an analog format to a signal 186B (e.g., a second converted signal) having a digital format. Signals 186A and 186B (and further signal 186C as further described below) can be transmitted from A/D converter 150 or 160 (or comparator 170, as further described below) to a communication architecture, such as a bus 199, whereby signal 186A can be forwarded on output channel 180, signal 186B can be forwarded on output channel 182, and signal 186C can be forwarded on output channel 184. Bus 199 can be of any configuration to facilitate communication with the instrumentation system 100 and an external component(s)/interface(s), where, in a non-limiting list, bus 199 can be a fieldbus, a local bus, an external bus, a serial bus, a parallel bus, and the like.

In an embodiment, the A/D converter 150 can operate as a low speed A/D converter, and in another embodiment, the A/D converter 160 can operate as a high speed A/D converter, i.e., the A/D converter 160 can operate at a higher sampling rate than the A/D converter 150. In an exemplary embodiment, the A/D converter 150 can be operating with a sampling rate of about 2 milliseconds (ms), while the A/D converter 160 can be operating with a sampling rate of about 5 megasamples per second (MS/s). Hence, for an equivalent period of time (e.g., 1 second), a number of instances of digital data (or samples) in signal 186B is greater than a number of instances of digital data in signal 186A, and hence, for the equivalent period of time, the signal 186B requires more communication bandwidth (e.g., on bus 199) than the signal 186A. As previously mentioned, to conserve communication bandwidth on bus 199, in an embodiment, when process 106 is operating under conditions which require minimal monitoring, instrumentation system 110 can operate with only data comprising signal 186A being transmitted on output channel 180. Alternatively, when a greater understanding of how process 106 is operating, data comprising signal 186B can be transmitted on output channel 182. In another embodiment, data comprising signal 186A can also be sent (e.g., on output channel 180) concurrently with signal 186B data (e.g., on output channel 182) during the period where greater understanding of how process 106 is operating is required. By operating with the requirement to only utilize low bandwidth demand, the various embodiments presented herein can be considered to facilitate a form of bandwidth compression on the bus 199.

In a further embodiment, instrumentation system 110 can further comprise a comparator 170, whereby comparator 170 can be a circuit configured to perform event detection. For example comparator 170 can be a bi-level comparator circuit which can transition in a binary manner, '0' to '1' to '0', etc. As described further herein, comparator 170 can utilize a reference threshold value 172 which can be utilized to determine whether signal 136C is below, equal to, above, or within a particular range of the threshold value 172, and accordingly a processing status of process 106 can be identified and/or inferred. When a signal transition is detected by comparator 170, a transition signal 186C, such as a '1' or a '0' can be forwarded by comparator 170 on channel 184. Such a transition signal can be accompanied by other data, such as a timestamp indicating when the transition occurred. Similarly, signals 186A and 186B can include a packet header(s), a timestamp(s), etc., to facilitate understanding of when a particular instance of data in signal 186A or signal 186B was generated, its position in a sequence of data, etc.

In a further embodiment, a transition signal 186D can be transmitted from comparator 170 to a controller circuit 177, to facilitate control of either A/D converter 160 or A/D converter 150. For example, upon receipt of a transition signal 186D indicating that process 106 has gone into a state requiring a high level of monitoring (e.g., transition signal 186D includes a value of '1' indicating an 'event' has occurred), controller circuit 177 can initiate transmission of signal 186B from A/D converter 160 on output channel 182. Upon subsequent receipt of a transition signal 186D that indicates that process 106 has returned to a state requiring low level monitoring (e.g., transition signal 186D includes a value '0'), controller circuit 177 can cease transmission of the signal 186D on the output channel 182 of A/D converter 160.

Based upon an operational configuration of any of A/D converter 150, A/D converter 160, controller circuit 177, and/or comparator 170, as mentioned previously, various signaling regimes can occur on outputs 180, 182, or 184. For example, a signal 186A can be continuously transmitted out from A/D converter 150 on output 180 as the sampling rate of A/D converter 150 is of a low magnitude with an according minimal bandwidth burden being generated at output 180.

However, owing to the bandwidth burden imposed by the higher sampling rate data 186B of A/D converter 160 it is desired that signaling 186B only occurs on output 182 when the process 106 is deemed to be in an "event state" or "high monitor" mode, and event capture and streaming regimes can be initiated. The determination of an event occurring can be a simple determination of whether the magnitude of signal 136C equals, exceeds, is within a percentage of, etc., the threshold value 172, as previously described. Other methods known to those in the art for determining an "event state" are also possible and considered to be within the scope of the various embodiments presented herein. It is to be appreciated that while the various embodiments presented herein relate to one or more situations where a signal transitions from a low level, 'no event' state to a high level, 'event' state, the various embodiments are not so limited and other transitions can be utilized. For example, a signal transition to be determined is a drop from a 'no event' state having a high magnitude (e.g., a high voltage) to an 'event' state having a low magnitude (e.g., a low voltage).

As previously mentioned, it is to be appreciated that the signal 120 can be continuously received, replicated, and directed by DEMUX 140, and accordingly, analog to digital signal conversion can be continuously occurring at A/D converter 150 (e.g., signal 136A converted to signal 186A) and A/D converter 160 (e.g., signal 136B converted to signal 186B), along with continual analysis of signal 136C being performed by comparator 170. To prevent unwanted bandwidth burden occurring, any of output signals 186A, 186B, or 186C can be discarded at the source. For example, if the process 106 is operating in a condition such that high sampling rate signals 186B are not required from A/D converter 160, any signaling generated at A/D converter 160 can be discarded (e.g., per controller circuit 177) and thus not transmitted over output channel 182.

As previously mentioned, the comparator 170 can be configured to detect a change in a state of sensor 105 (and accordingly process 106), based upon, for example, a threshold value 172. For example, a signal 136C being carried on channel 134 can be a voltage (e.g., sensor 105 is a thermocouple) and comparator 170 can be configured such that if the voltage of signal 136C becomes greater than (e.g., crosses) a reference threshold 172 applied to comparator 170, the comparator 170 can flip its operational state, e.g., transition from binary state '0' to binary state '1'. Accordingly, in an embodiment, a configuration component 176 can be utilized to program the comparator 170 with a threshold value 172, with the threshold value 172 being stored local on comparator 170 (e.g., in a local memory, not shown). Hence, rather than having comparator 170 operating with a fixed threshold value, utilizing a configuration component 176 enables a flexible approach to signal magnitude determination that is not available with a conventional system. It is to be appreciated that while the configuration component 176 is illustrated in FIG. 1 as being located local to comparator 170, the various embodiments are not so limited and in an alternative embodiment configuration component 176 can be located remote from the comparator 170, and accordingly, in communication with comparator 170 via bus 199.

As previously mentioned, to prevent unwanted bandwidth burden occurring, any of output signals 186A, 186B, or 186C can be discarded at the source, e.g., signals 186B can be discarded at the A/D converter 160 and not transmitted on channel 182. In another embodiment, a memory component such as a memory buffer 190 can be incorporated into system 110. When an event is detected by comparator 170, data comprising signal 186B can be forwarded to the bus 199. However, there may be a delay or lag between an event being detected at the comparator 170 and the initiation of forwarding signal 186B, per controller circuit 177. Hence, rather than discarding any signal 186B generated by the A/D converter 160 prior to the detection of the event, a most recent portion of signal 186B can be stored in the memory buffer 190, whereby the most recent portion of signal 186B can be subsequently replaced by the next most recent portion of signal 186B, e.g., to maintain a constant amount of the most recent data comprising signal 186B. When an event is determined at the comparator 170, rather than simply transmitting the next received data converted by A/D converter 170, to compensate for the lag between the event determination and the transmission of the next generated data in signal 186B, the various data stored in memory buffer 190 can also be forwarded to the bus 199, thereby provisioning data generated both pre-event and post-event occurrence to be forwarded on the bus 199 to facilitate possible improved analysis and/or determination of what may have caused the transition in operation of process 106 at the time the 'event' was detected at comparator 170.

In another embodiment, configuration component 176 can be utilized to adjust a sampling frequency of either of the A/D converter 150 and/or A/D converter 160. For example, A/D converter 160, in a first sampling condition can operate with a sampling rate of about 5 MS/s, while in a second sampling condition it is desirable that the A/D converter 160 operate with a sampling rate of about 10 MS/s. The configuration component 176 can be utilized to configure the A/D converter 150 and/or the A/D converter 160 to any desired sampling rate.

In a further embodiment, configuration component 176 can include a sampling frequency database 178 which, in a further embodiment, can include a sampling schedule. As a process 106 undergoes various stages of execution, the configuration component 176 can, in conjunction with timings in the sampling frequency database 178, automatically transmit a sampling rate to either of A/D converter 150 and/or the A/D converter 160. Hence, after a process has been in operation for a particular duration and a particular sampling rate, at commencement of subsequent duration as identified by a time in the sampling frequency database 178, a new sampling rate can be generated and transmitted to automatically configure either of A/D converter 150 and/or the A/D converter 160.

Figure 2:
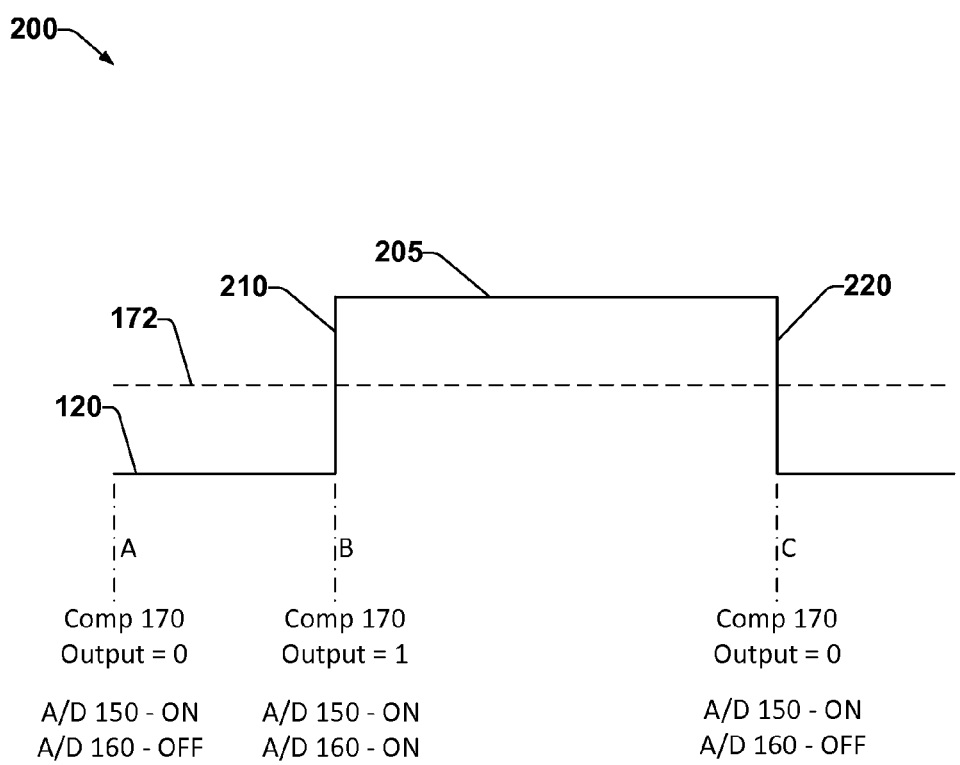
FIG. 2 presents a diagram illustrating various stages of a pulse and associated actions, according to an embodiment.

Turning to FIG. 2, to provide an exemplary context of operation for the various components comprising system 100, signal 120 is presented in conjunction with various states and/or conditions based upon a magnitude of the signal 120. As previously mentioned, system 110 has the ability to monitor slow events as well as identifying fast events which, for example, may occur unexpectedly. For instance, it may be known that process 106 may include a pulse event that is of a fixed duration, e.g., of 200 microseconds duration. Rather than having to continuously sample signal 120 at a high speed, per operation of a conventional system, the comparator 170 can be utilized to detect a change in the magnitude of a signal.

For example, as shown in FIG. 2, at a time 'A', signal 120 has a low magnitude (e.g., is below threshold value 172), for which comparator 170 outputs an event value of '0', and in accordance therewith, A/D converter 150 is in an 'ON' state and a signal 186A is transmitted on output 180. Owing to the event value being '0' or 'no event', a transmission setting of A/D converter 160 is set to 'OFF' (e.g., by controller circuit 177) and signal 186B is not transmitted on channel 182, e.g., signal 186B can be discarded or stored in buffer 190.

At a time 'B', the magnitude of signal 120 is determined by the comparator 170 to have increased above the threshold value 172, e.g., the rise of a leading edge 210 of a pulse 205 has been detected. Based thereon, comparator 170 outputs an event value of '1' or 'event', and in accordance therewith, A/D converter 150 remains in an 'ON' state. Further, A/D converter 160 also transitions to an 'ON' state (e.g., per controller circuit 177) and the high sample rate signal 186B can be forwarded from the A/D converter 160 to the bus 199.

At a time 'C', the magnitude of signal 120 drops below threshold value 172 and a trailing edge 220 of the pulse 205 has been detected. Based thereon, comparator 170 outputs an event value of '0' or 'no event', and in accordance therewith, A/D converter 150 remains in an 'ON' state. Further, A/D converter 160 transitions to an 'OFF' state (e.g., per controller circuit 177) and transmission of the high sample rate signal 186B can be curtailed (e.g., subsequently discarded, directed to a memory buffer 190, etc.).

With reference to FIGS. 1 and 2, it is to be appreciated that while three components (e.g., A/D converter 150, A/D converter 160, and comparator 170) are shown connected to the DEMUX 140, a greater or lesser number of components can connected to DEMUX 140. For example, an arrangement can be configured whereby a single A/D converter (e.g., either of A/D converter 150 or A/D converter 160) is connected to DEMUX 140 in conjunction with a comparator 170. In such an embodiment, the comparator 170 can perform the previously described signal analysis, and when the signal 136C includes an event (e.g., a pulse leading edge 210, a pulse trailing edge 220, etc.) a notification 186D can be transmitted to controller circuit 177 indicating an event has been detected. Upon receiving the notification, controller circuit 177 can operate to initiate transmission of data pulses (e.g., signal 186B) from the A/D converter (e.g., A/D converter 160) to the bus 199. In response to receiving an indication from the comparator 170 that the event has ceased (e.g., the pulse has ended) the A/D converter can stop transmission of the data pulses to the bus 199 (e.g., per operation of the controller circuit 177). With such a configuration, data transmission on the bus can be controlled such that bandwidth on the bus 199 is only consumed during an 'event' occurring.

Referring to FIG. 1, in a further embodiment, configuration component 176 can be utilized to override a setting applied to any of the A/D converter 150, the A/D converter 160, or the comparator 170. For example, configuration component 176 can transmit a command 179 to A/D converter 160 (e.g., via controller circuit 177) to pause transmission of signal 186B on output channel 182 even though the A/D converter 160 has been instructed to transmit the signal 186B based upon an 'event' notification generated by comparator 170. In another example, a transmit command 179 can be forwarded from configuration component 176 (e.g., via controller circuit 177) to initiate transmission of signal 186B by A/D converter 160 even though a 'no event' command has been forwarded to the A/D converter 160.

It is to be appreciated that while only a single input channel 115 and three channels 130, 132, and 134 are illustrated in FIG. 1 for system 110 and DEMUX 140, any number of input channels and output channels can be utilized. For example, N output channels can be configured, where N is a positive integer, whereby an output channel in the N output channels can be connected to any of an A/D converter, a comparator component, a signal processing component, etc. Hence, a first input channel can be connected directly to an A/D converter and accordingly samples and/or converts an incoming signal on the first input channel. Further, a second input channel can be connected to a signal sharing component (e.g., DEMUX 140) which is further connected to a first A/D converter, a second A/D converter, and a comparator (an arrangement as shown in FIG. 1). Furthermore a third input channel can be connected to a signal sharing component (e.g., another DEMUX 14) which is further connected to another A/D converter and another comparator component, whereby 'no event' and 'event' notifications generated by the another comparator can control operation of the another A/D converter.

As further shown in FIG. 1, while system 100 has been described with signal 120 being an input to DEMUX 140 via input channel 115, in an alternative embodiment, sensor 105 can be connected directly to an input channel of comparator 170. As shown by the dashed line 116, a signal 121 can be inputted to comparator 170, and accordingly, can bypass DEMUX 140. Signal 121 can be processed at comparator 170 in the same manner as signal 136C, as previously described. It is to further be appreciated that while input channel 116 is shown to originate from input channel 115, the various embodiments presented herein are not so limited. For example, in another embodiment, the input channel 116 can be connected directly to sensor 105, with signal 121 obtained at comparator 170 in parallel with signal 120 input at DEMUX 140.

It is to be further appreciated that signal 121 can be received at the comparator 170 concurrent with any of signal 120 arriving at DEMUX 140, and/or signals 136A and/or 136B respectively arriving at A/D converter 150 or A/D converter 160. In an embodiment, the concurrent reception can facilitate simultaneous processing of respective signals 120, 136A, 136B and/or 121. For example, generation of one or more of signals 136A and/or 136B by DEMUX 140 may result in a slight delay between equivalent data (e.g., simultaneous or concurrent data) being generated in signal 136A and/or signal 136B and the data conveyed in signal 121, e.g., presence of a corresponding signal spike present in all of signals 136A, 136B, and/or 121. In an embodiment, owing to signal 121 not undergoing any delay, a data spike in signal 121 may arrive at comparator 170 prior to an equivalent data spike arriving at either of A/D converter 150 (e.g., in signal 136A) and/or A/D converter 160 (e.g., in signal 136B). Accordingly, advantage can be taken of the prior arrival of the data spike in signal 121 to facilitate processing of data in signal 121 (e.g., comparison with threshold value 172) at a time instant prior to the equivalent data spike in signal 136B arriving at A/D converter 160. Hence, operation of A/D converter 160 can be switched to transmit signal 186B (e.g., by controller 177) to facilitate the equivalent data spike in signal 136B being converted to a digital signal 186B without any delay (e.g., no buffering occurs at buffer memory 190) and subsequently transmitted in output channel 182.

Figure 3:
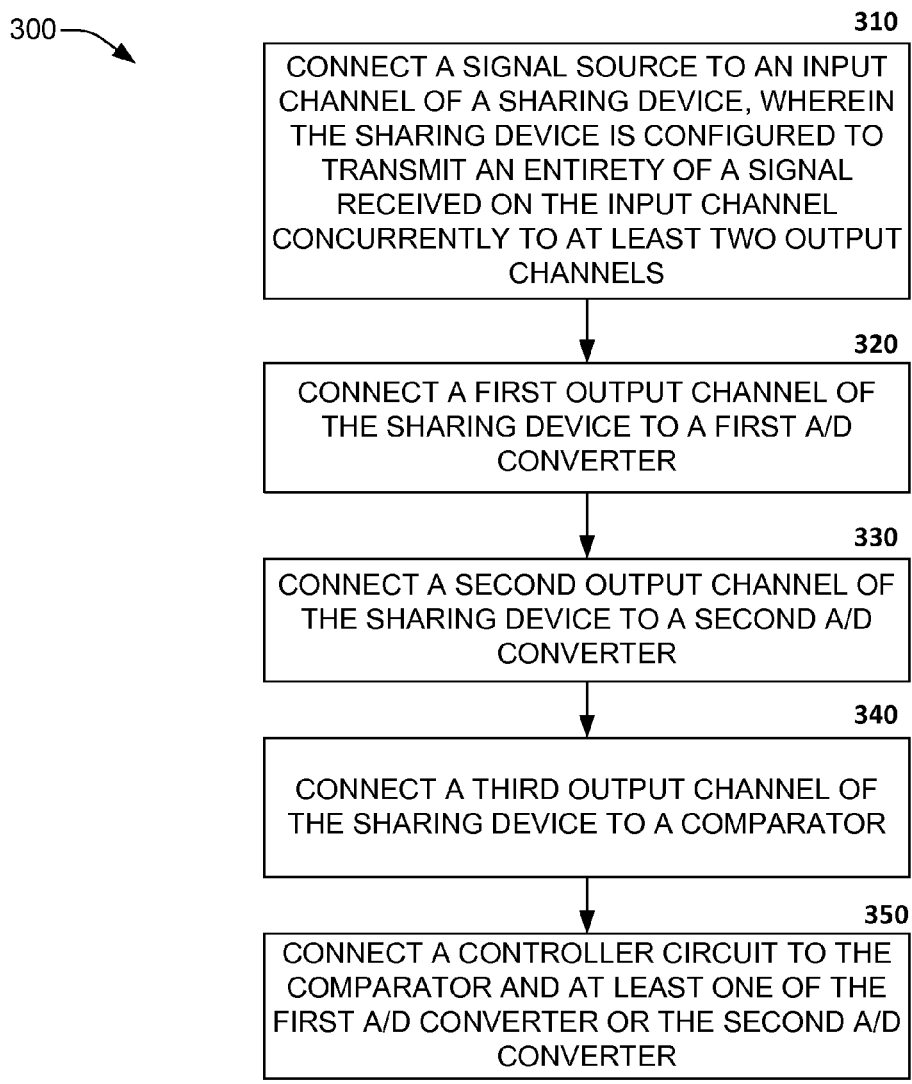
FIG. 3 is a flow diagram illustrating an exemplary methodology for connection of various system components for concurrent signaling.
Figure 4:
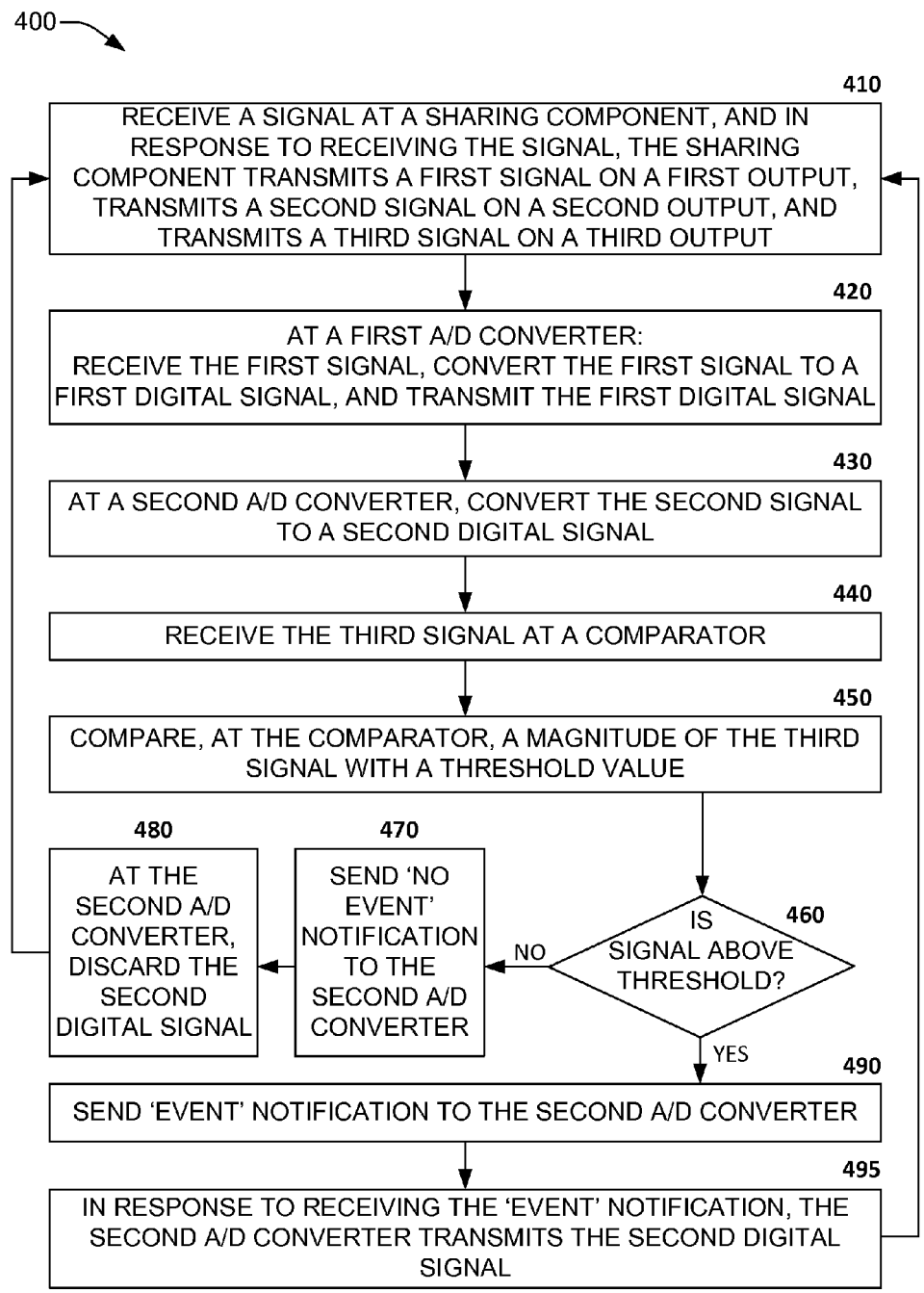
FIG. 4 is a flow diagram illustrating an exemplary methodology for controlling signal transmission.
Figure 5:
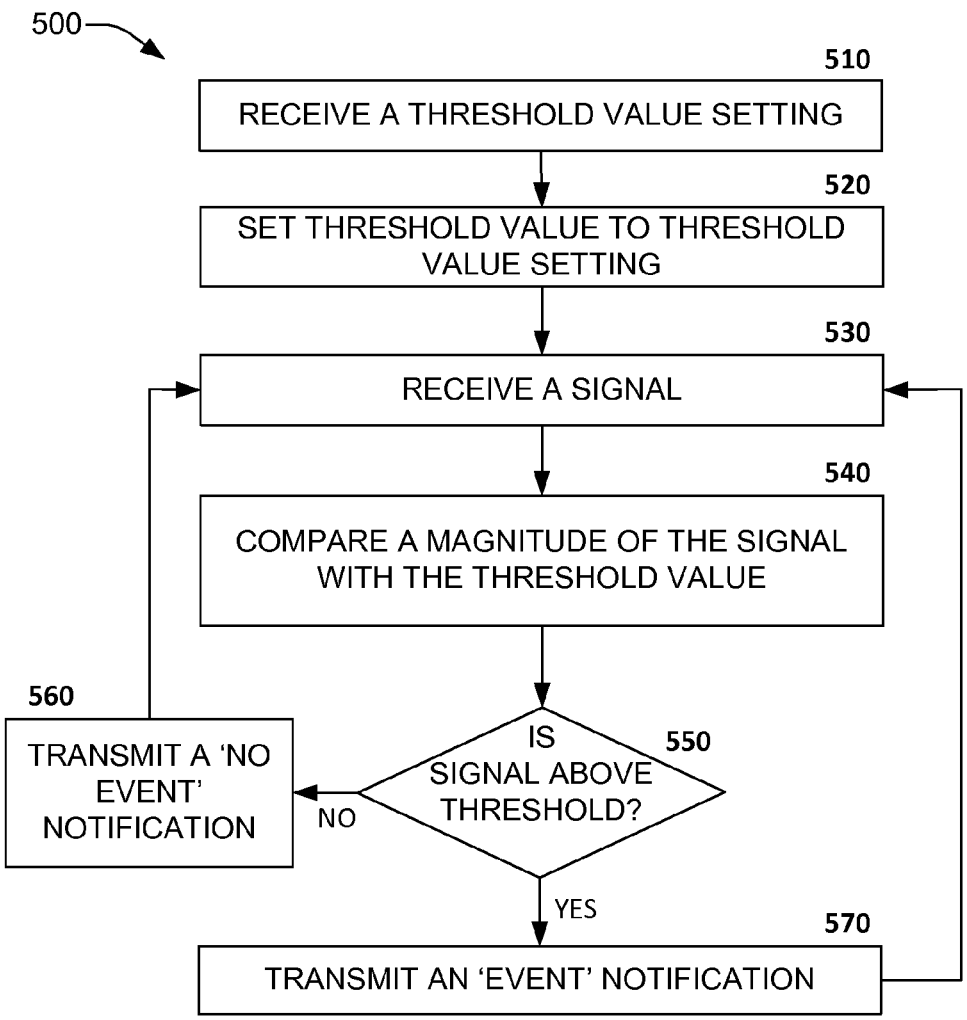
FIG. 5 is a flow diagram illustrating an exemplary methodology for setting a threshold setting.

FIGS. 3-5 illustrate exemplary methodologies relating to concurrently share signal data to facilitate controlling communication bandwidth requirements. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement the methodologies described herein.

FIG. 3 presents an exemplary methodology 300 relating to transmitting data from a single source to a plurality of components to facilitate concurrent signal processing, transmission, and analysis by the plurality of components. At 310, a signal source can be connected to an input channel of a signal sharing component. As previously mentioned, the signal source can be a sensor or similar device configured to generate a signal in accordance with one or more operating conditions of a process. For example, the sensor can be a thermocouple, a pressure sensor, an accelerometer, a composition determining component, etc. In an embodiment the signal produced by the sensor is an analog signal, e.g., a continuous signal with a time varying variable. The signal sharing component can be configured to transmit an entirety of a signal received from the signal source to at least two channels. In an embodiment, the signal sharing component can be a DEMUX.

At 320, a first output channel of the signal sharing component can be connected to a first A/D converter component.

At 330, a second output channel of the signal sharing component can be connected to a second A/D converter component.

At 340, a third output channel of the signal sharing component can be connected to a comparator component.

At 350, a controller circuit can be connected to the comparator and at least one of the first A/D converter and the second A/D converter. In an embodiment, the controller circuit can operate in conjunction with determinations made by the comparator component, and accordingly, can control transmission of data from at least one of the first A/D converter or the second A/D converter.

As previously mentioned, it is to be appreciated that the signal sharing component, the first A/D converter, the second A/D converter, and the comparator can be incorporated into a single ASIC component. Hence, while a single signal source can be connected to a single input pin of the ASIC component, owing to the sharing of the signal across a plurality of components incorporated into the ASIC component, a plurality of signals can be transmitted from the ASIC component (e.g., from a plurality of output pins of the ASIC) based upon the single signal input.

Turning to FIG. 4, FIG. 4 illustrates an exemplary methodology 400 relating to controlling signal transmission to facilitate control of communication bandwidth requirements of a signal processing component. At 410, a signal can be received at a signal sharing component, and in response to receiving the signal, the signal sharing component can transmit a first signal on a first output of the signal sharing component, a second signal on a second output of the signal sharing component, and a third signal on a third output of the signal sharing component. As previously described, the signal sharing component can be configured such that the first signal, the second signal, and the third signal contain the same signal information and can be considered to be replications of the received signal (e.g., received from a sensor connected to the signal sharing component).

At 420, at a first A/D converter the first signal can be received, and in response to receiving the first signal the first signal can be converted (e.g., from an analog format) to a first output signal (e.g., having a digital format, aka a first digital sample signal). The first output signal can be transmitted, via an output channel of the first A/D converter, to an external circuit, for example, a communication bus.

At 430, at a second A/D converter the second signal can be received, and in response to receiving the second signal the second signal can be converted (e.g., from an analog format) to a second output signal (e.g., having a digital format, aka a second digital sample signal). As previously described, the second signal can be a continuous analog waveform while the second output signal can comprise of at least one instance of data generated by the first A/D converter from the input signal.

At 440, at a comparator the third signal can be received.

At 450, the comparator can compare a magnitude of the third signal with a threshold value.

At 460, in response to the comparator determining that the magnitude of the third signal is not greater than the threshold value, at 470 a notification can be forwarded to the second A/D converter indicating that 'no event' has occurred. As previously described, the second A/D converter can operate in conjunction with a controller circuit and, accordingly, transmission of data from the second A/D converter on an output channel can be controlled by the controller circuit.

At 480, at the second A/D converter, in response to receiving the 'no event' notification (e.g., via the controller circuit), the second output signal can be discarded by the second A/D converter. As mentioned previously, rather than discarding the second output signal the second output signal can be forwarded to a buffer memory to facilitate storage of the second output signal, either on a temporary or an extended time period basis. The methodology returns to 410 for the next signal to be received.

Returning to 460, in response to the comparator determining that the magnitude of the third signal is greater than the threshold value, at 490 a notification can be forwarded to the second A/D converter (e.g., in accordance with operation of the controller circuit) indicating that an 'event' has occurred.

At 495, at the second A/D converter (e.g., in conjunction with the controller circuit), in response to receiving the 'event' notification, the second A/D converter can be configured to transmit the second output signal on an output channel of the second A/D converter. The output channel of the second A/D converter can be connected to the same external circuit, or a different circuit, to that which the first A/D converter transmits the first output signal. The methodology returns to 410 for the next signal to be received.

As previously described, the first signal can be a continuous analog waveform while the first output signal and/or the second output signal can comprise of at least one digital data generated, respectively by the first A/D converter or the second A/D converter, from the input signal, whereby the first output signal and/or the second output signal can have a digital format. Each at least one digital data in the first output signal and/or the second output signal can include any information required to identify a source of the at least one digital data, a time of generation, cyclic redundancy checking, etc.

FIG. 5 illustrates an exemplary methodology 500 relating to configuring a threshold value and controlling transmission of data to facilitate control of communication bandwidth requirements of a signal processing component. At 510, a threshold value setting can be received at a comparator component. In an embodiment, the threshold value setting can be generated by a configuration component (e.g., a user interface) remotely located to the comparator component.

At 520, in response to receiving the threshold value setting, a threshold value can be configured based upon the received threshold value setting. In an embodiment, the threshold value can be stored locally at the comparator (e.g., in a local memory). In an aspect where the threshold value setting is an initial setting for the threshold value, the threshold value can be set to the threshold value setting. In an alternative aspect, a current setting for the threshold value can be updated with the received threshold value setting. By receiving a threshold value setting and subsequently updating a threshold value with the threshold value setting, the threshold value can effectively be updated in an on-the-fly reconfiguration.

At 530, a signal can be received at the comparator component. As previously described, the signal can be received from a signal sharing component that concurrently sends a replication of the signal to at least one other circuit or component (e.g., a signal processing circuit/component such as an A/D converter). In an embodiment, the received signal can be an analog signal.

At 540, the comparator can compare a magnitude of the received signal with the threshold value.

At 550, in response to the comparator determining that the magnitude of the received signal is not greater than the threshold value, at 560 a notification can be transmitted indicating that 'no event' has occurred. The methodology can return to 530 for the next received signal to be compared with the threshold value.

At 560, in response to the comparator determining that the magnitude of the received signal is not greater than the threshold value, at 570 a notification can be transmitted indicating that an 'event' has occurred. The methodology can return to 530 for the next received signal to be compared with the threshold value.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An integrated circuit comprising:
    a first analog to digital (A/D) converter;
    a second A/D converter; and
    a signal sharing component, the signal sharing component comprising:
        an input pin;
        a first output pin communicatively coupled to the first A/D converter; and
        a second output pin communicatively coupled to the second A/D converter, wherein the signal sharing component:
    receives a process signal on the input pin; and
    directs the process signal to each of the first output pin and the second output pin, such that a first sample of the process signal is received by the first A/D converter and a second sample of the process signal is received by the second A/D converter, the first A/D converter processes the first sample of the process signal at a first sampling rate to form a first converted signal, the second A/D converter processes the second sample of the process signal at a second sampling rate to form a second converted signal, and the first sampling rate is lower than the second sampling rate.

2. The integrated circuit of claim 1, wherein the signal sharing component is a demultiplexor.

3. The integrated circuit of claim 1, wherein the process signal is an analog signal.

4. The integrated circuit of claim 1, wherein the first A/D converter further comprises a third output pin, and the second A/D converter further comprises a fourth output pin.

5. The integrated circuit of claim 4, further comprising a comparator that comprises a fifth output pin, the comparator is configured to receive the process signal, perform a comparison between a magnitude of the process signal and a threshold value, and output a signal based upon the comparison.

6. The integrated circuit of claim 5, wherein the first A/D converter transmits the first converted signal on the third output pin when the signal output by the comparator indicates that the magnitude of the process signal received at the comparator is below the threshold value.

7. The integrated circuit of claim 6, further comprising a memory buffer, the second A/D converter transmits the second converted signal to the memory buffer over the fourth output pin when the signal output by the comparator indicates that the magnitude of the process signal received at the comparator is below the threshold value.

8. The integrated circuit of claim 5, wherein the second A/D converter transmits the second converted signal on the fourth output pin when the signal output by the comparator indicates that the magnitude of the process signal received at the comparator is equal to, or above, the threshold value.

9. The integrated circuit of claim 5, further comprising a configuration component, the configuration component facilitates programming of the comparator with a threshold value setting, wherein the threshold value setting is utilized to configure the threshold value.

10. The integrated circuit of claim 1, wherein the integrated circuit is incorporated into an application-specific integrated circuit (ASIC).

11. A method comprising:
    receiving a process signal on an input channel of a signal sharing component;
    concurrently forming a first replication of the process signal, a second replication of the process signal, and a third replication of the process signal;
    transmitting the first replication of the process signal to a first analog to digital (A/D) converter, wherein the first A/D converter:
        converts the first replication of the process signal to a first digital signal; and
        transmits the first digital signal on a first communication bus;
    transmitting the second replication of the process signal to a second A/D converter, wherein the second A/D converter converts the second replication of the process signal to a second digital signal wherein the first A/D converter is configured to convert the first replication of the process signal to the first digital signal at a sampling rate that is less than the sampling rate utilized by the second A/D converter to convert the second replication of the process signal to the second digital signal; and
    transmitting the third replication of the process signal to a comparator, wherein the comparator compares a magnitude of the third replication of the process signal to a threshold value and in response to determining that the magnitude of the third replication of the process signal is greater than the threshold value, the comparator transmits a first notification that causes the second digital signal to be output on the communication bus.

12. The method of claim 11, wherein the signal sharing component, the first A/D converter, the second A/D converter, and the comparator are incorporated into an application-specific integrated circuit (ASIC).

13. The method of claim 11, further comprising receiving at the comparator a threshold value setting, and in response to receiving the threshold value setting, updating the threshold value to equal the threshold value setting.

14. The method of claim 11, wherein, in response to receiving the first notification at a controller, the controller initiates transmission of the second digital signal at the second A/D converter, the transmission is to the communication bus.

15. The method of claim 11, further comprising:
at the comparator:
  determining that the magnitude of the third replication of the process signal is less than the threshold value; and
  in response to determining the magnitude of the third replication of the process signal is less than the threshold value, transmitting a second notification to the controller.

16. The method of claim 15, further comprising:
causing the second digital signal to be discarded at the second A/D converter.

17. A method comprising:
receiving a process signal on an input channel of a signal sharing component;
forming a first replication of the process signal and a second replication of the process signal;
transmitting the first replication of the process signal to a first analog to digital (A/D) converter;
at the first A/D converter and at a first sampling rate, converting the first replication of the process signal to a first sample signal and transmitting the first sample signal on a communication bus; and
transmitting the second replication of the process signal to a second A/D converter;
at the second A/D converter and at a second sampling rate that is higher than the first sampling rate, converting the second replication of the process signal to a second sample signal
storing the second sample signal in a memory buffer;
receiving the process signal at a comparator, wherein the process signal is received at the comparator concurrent with the process signal being received at the signal sharing component, wherein the comparator compares a magnitude of the process signal to a threshold value and in response to determining the magnitude of the process signal is greater than the threshold value, the comparator transmits a notification that causes the second sample signal to be output on the communication bus.

* * * * *